(12) United States Patent
Gathman et al.

(10) Patent No.: US 10,651,807 B2
(45) Date of Patent: May 12, 2020

(54) COMPLEMENTARY VARIABLE GAIN AMPLIFICATION

(71) Applicant: Qualcomm Incorporated, San Diego, CA (US)

(72) Inventors: Timothy Donald Gathman, San Diego, CA (US); Chirag Dipak Patel, San Diego, CA (US); Lai Kan Leung, San Marcos, CA (US); Xinmin Yu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/115,475

(22) Filed: Aug. 28, 2018

(65) Prior Publication Data

US 2020/0076387 A1    Mar. 5, 2020

(51) Int. Cl.
| | | |
|---|---|---|
| H03F 3/04 | (2006.01) | |
| H03F 1/22 | (2006.01) | |
| H03F 3/68 | (2006.01) | |
| H03F 1/02 | (2006.01) | |
| H03F 3/195 | (2006.01) | |

(52) U.S. Cl.
CPC ............. *H03F 3/68* (2013.01); *H03F 1/0205* (2013.01); *H03F 3/195* (2013.01); *H03F 2200/297* (2013.01); *H03F 2200/451* (2013.01); *H03F 2200/48* (2013.01); *H03F 2200/75* (2013.01)

(58) Field of Classification Search
CPC .............. H03F 1/22; H03F 1/223; H03F 3/04
USPC .................................................. 330/288, 311
See application file for complete search history.

(56) References Cited

U.S. PATENT DOCUMENTS

| | | | |
|---|---|---|---|
| 6,359,605 B1 | 3/2002 | Knapp et al. | |
| 6,369,618 B1 | 4/2002 | Bloodworth et al. | |
| 6,590,433 B2 | 7/2003 | Clee et al. | |
| 6,753,734 B2 | 6/2004 | Arell et al. | |
| 6,777,999 B2 | 8/2004 | Kanou et al. | |
| 7,154,335 B2 | 12/2006 | Elmala et al. | |
| 7,196,555 B2 | 3/2007 | Taylor | |
| 7,230,410 B1 | 6/2007 | Jordan | |
| 7,567,122 B2 | 7/2009 | Sowlati | |

(Continued)

OTHER PUBLICATIONS

Chang C-C., et al., "CMOS Current-Mode Exponential-Control Variable-Gain Amplifier", Electronics Letters, Jul. 2001, vol. 37, No. 14, DOI: 10.1049/el:20010593, pp. 868-869.

(Continued)

*Primary Examiner* — Steven J Mottola
(74) *Attorney, Agent, or Firm* — Colby Nipper/QUALCOMM Incorporated

(57) ABSTRACT

An apparatus is disclosed for complementary variable gain amplification. In an example aspect, the apparatus includes a variable gain amplifier that includes multiple amplifiers. The multiple amplifiers include at least one first amplifier and at least one second amplifier cascaded together in series. The first amplifier includes a first set of transistors having a first doping type. At least a portion of the first set of transistors is configured to implement a first current mirror. The second amplifier includes a second set of transistors having a second doping type. At least a portion of the second set of transistors is configured to implement a second current mirror. The second current mirror is coupled to the first current mirror.

30 Claims, 6 Drawing Sheets

(56) References Cited

U.S. PATENT DOCUMENTS

| 7,724,092 B2* | 5/2010 | Quan ............... H03L 7/107 330/288 |
| 8,102,209 B2 | 1/2012 | Jang et al. |
| 9,124,230 B2 | 9/2015 | Akyol et al. |
| 2017/0085223 A1 | 3/2017 | Musiol et al. |
| 2019/0296692 A1 | 9/2019 | Patel et al. |

OTHER PUBLICATIONS

Dongi M., et al., "A Wideband CMOS VGA with dB-Linear Gain Based on Active Feedback and Negative Capacitance", IEEE, 25th Iranian Conference on Electrical Engineering (ICEE2017), May 2017, pp. 506-510.

Mahmoud S.A., "Low Voltage Current-Mode Digitally Controlled VGA Based on Digitally Programmble Current Conveyors", IEEE 51st Midwest Symposium on Circuits and Systems (MWSCAS), 2008, pp. 814-817.

* cited by examiner

500

```
┌─────────────────────────────────────────┐
│ Accept, via a first amplifier comprising a first │
│ set of transistors having a first doping type, an │
│ input signal that comprises a first intermediate- │
│ frequency signal and a first reference current │
│                    502                   │
└─────────────────────────────────────────┘
                    ↓
┌─────────────────────────────────────────┐
│ Produce, via the first set of transistors, a first │
│ amplified signal comprising a second intermediate- │
│ frequency signal and a second reference current, the │
│ second reference current based on the first reference │
│ current, the second intermediate-frequency signal │
│ based on the first intermediate-frequency signal │
│                    504                   │
└─────────────────────────────────────────┘
                    ↓
┌─────────────────────────────────────────┐
│      Bias, using the second reference current, │
│      a second amplifier comprising a second set │
│      of transistors having a second doping type │
│                    506                   │
└─────────────────────────────────────────┘
                    ↓
┌─────────────────────────────────────────┐
│ Produce, via the second set of transistors, a second │
│ amplified signal comprising a third intermediate-frequency │
│ signal, the third intermediate-frequency signal based │
│ on the second intermediate-frequency signal │
│                    508                   │
└─────────────────────────────────────────┘
```

FIG. 5

COMPLEMENTARY VARIABLE GAIN AMPLIFICATION

TECHNICAL FIELD

This disclosure relates generally to wireless transceivers and, more specifically, to a variable gain amplifier including cascaded amplifiers having transistors with alternating doping types.

BACKGROUND

Electronic devices use radio-frequency (RF) signals to communicate information. These radio-frequency signals enable users to talk with friends, download information, share pictures, remotely control household devices, receive global positioning information, employ radar for object detection and tracking, or listen to radio stations. As a distance over which these radio-frequency signals travel increases, a strength of the radio-frequency signals decreases, and it becomes increasingly challenging to distinguish the radio-frequency signals from background noise. To address this issue, electronic devices use variable gain amplifiers to amplify signals that are transmitted or received. Performance of a variable gain amplifier depends on several factors, including power consumption, gain, noise figure, or linearity. Power consumption is particularly relevant to battery-powered mobile devices. It may be challenging, however, to realize power savings without adversely impacting other performance parameters.

SUMMARY

An apparatus is disclosed that implements complementary variable gain amplification. The described techniques implement a variable gain amplifier with at least two amplifiers that are cascaded together and have transistors with alternating doping types. At least a first amplifier in the chain includes a current mirror that produces at least a portion of a reference current (e.g., a direct current (DC)) that biases a second amplifier in the chain. By providing at least a portion of the reference current used by a following amplifier, current consumption is reduced and power is conserved within the variable gain amplifier. In addition to the power savings, the gain, linearity, and noise figure can satisfy target performance thresholds for many operational modes (e.g., such as low-power modes, idle modes, or lesser order modulation modes such as quadrature phase-shift keying modes (QPSK)).

In an example aspect, an apparatus is disclosed. The apparatus includes a variable gain amplifier, which includes multiple amplifiers. The multiple amplifiers include at least one first amplifier and at least one second amplifier cascaded together in series. The first amplifier includes a first set of transistors having a first doping type. At least a portion of the first set of transistors is configured to implement a first current mirror. The second amplifier includes a second set of transistors having a second doping type. At least a portion of the second set of transistors is configured to implement a second current mirror. The second current mirror is coupled to the first current mirror.

In an example aspect, an apparatus is disclosed. The apparatus includes a variable gain amplifier, which includes multiple amplifiers. The multiple amplifiers include at least one first amplifier and at least one second amplifier cascaded together in series. The first amplifier includes a first input node, a first output node, and a first set of transistors having a first doping type. The first input node is configured to accept a first reference current. The first amplifier also includes first mirroring means for producing at least a portion of a second reference current at the first output node based on the first reference current via at least a portion of the first set of transistors. The second amplifier includes a second input node coupled to the first output node and a second set of transistors having a second doping type. At least a portion of the second set of transistors is configured to be biased via the second reference current.

In an example aspect, a method for complementary variable gain amplification is disclosed. The method includes accepting, via a first amplifier comprising a first set of transistors having a first doping type, an input signal that comprises a first intermediate-frequency signal and a first reference current. The method also includes producing, via the first set of transistors, a first amplified signal comprising a second intermediate-frequency signal and a second reference current. The second reference current is based on the first reference current, and the second intermediate-frequency signal is based on the first intermediate-frequency signal. The method additionally includes biasing, using the second reference current, a second amplifier comprising a second set of transistors having a second doping type. The method further includes producing, via the second set of transistors, a second amplified signal comprising a third intermediate-frequency signal. The third intermediate-frequency signal is based on the second intermediate-frequency signal.

In an example aspect, a variable gain amplifier is disclosed. The variable gain amplifier includes a first amplifier. The first amplifier includes a first input node, a first output node, at least a first amplifier branch, a first passive load, a first capacitor, and first current-reuse branch. The first passive load is coupled to the first amplifier branch. The first capacitor is coupled between the first output node and the first passive load. The first current-reuse branch is coupled to the first output node. The first amplifier also includes a first set of transistors having a second doping type. The first set of transistors is configured to implement a first current mirror. Different portions of the first current mirror are included as parts of the first amplifier branch and the first current-reuse branch. The variable gain amplifier also includes an active load coupled to the first output node. The active load comprises at least one transistor having a second doping type

BRIEF DESCRIPTION OF DRAWINGS

FIG. 3-1 illustrates an example of an amplifier for complementary variable gain amplification.

FIG. 3-2 illustrates another example of an amplifier for complementary variable gain amplification.

FIG. 5 is a flow diagram illustrating an example process for complementary variable gain amplification.

DETAILED DESCRIPTION

Some wireless transceivers use variable gain amplifiers to amplify signals that are transmitted or received. Performance of a variable gain amplifier depends on several factors, including power consumption, gain, noise figure, or linearity. It can be difficult to realize reduced power consumption while also achieving target gain, noise figure, and linearity performance. Some techniques, for example, may lower power consumption by reducing an amount of current that is drawn by a variable gain amplifier. The reduced current, however, may degrade the gain, noise figure, or linearity performance of the variable gain amplifier. Therefore, it can be challenging to realize power savings by reducing an amount of current that is drawn within variable gain amplifiers without adversely impacting other performance parameters.

To address such challenges, techniques for complementary variable gain amplification are described herein. The described techniques implement a variable gain amplifier with at least two amplifiers that are cascaded together and have transistors with alternating doping types. At least a first amplifier in the chain includes a current mirror that produces at least a portion of a reference current (e.g., a direct current (DC)) that biases a second amplifier in the chain. By providing at least a portion of the reference current used by a following amplifier, current consumption is reduced and power is conserved within the variable gain amplifier. In addition to the power savings, the gain, linearity, and noise figure may satisfy target performance thresholds for many operational modes (e.g., such as low-power modes, idle modes, or lesser-order modulation modes such as quadrature phase-shift keying (QPSK) modes).

Figure 1:
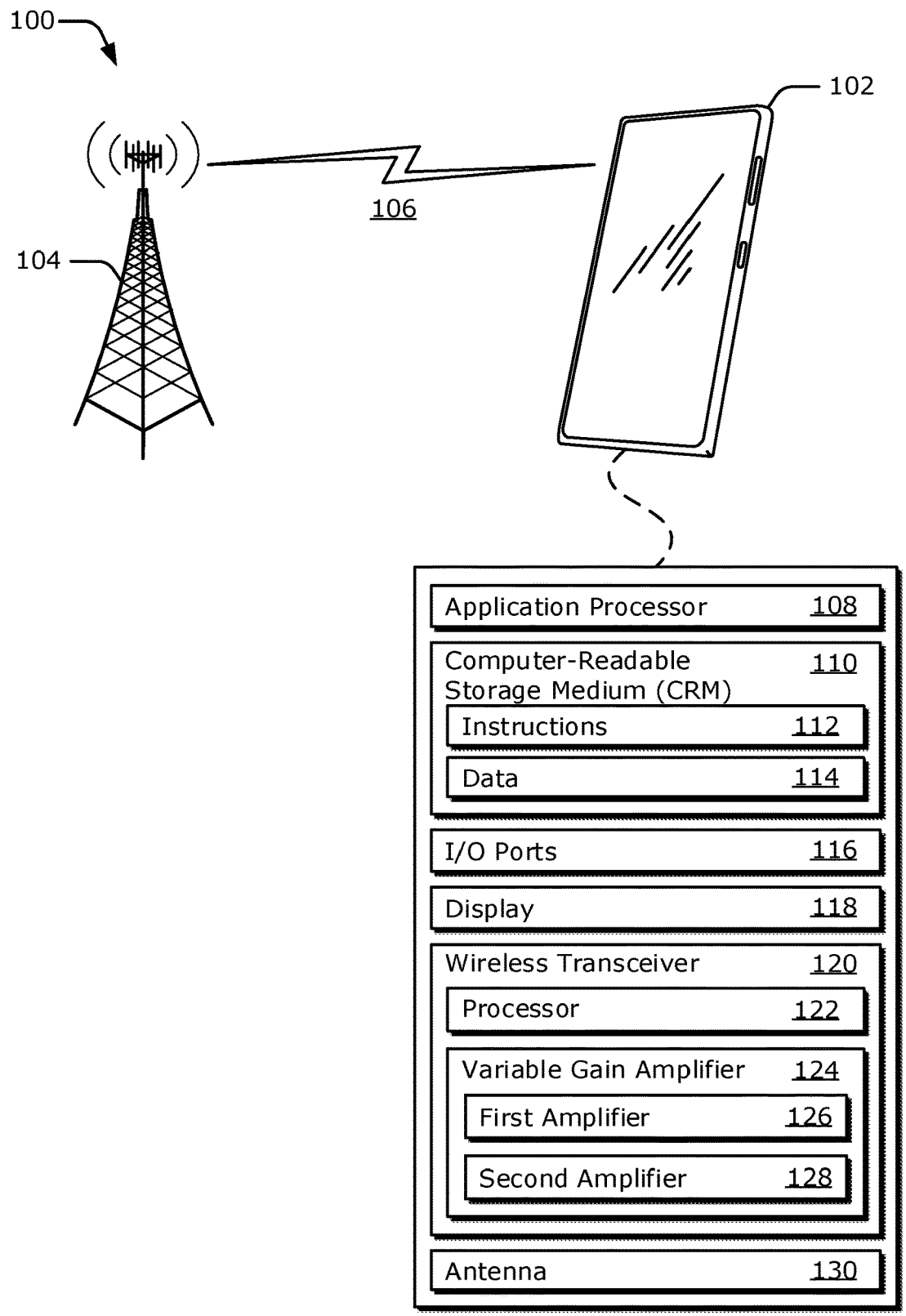
FIG. 1 illustrates an example computing device for complementary variable gain amplification.

FIG. 1 illustrates an example environment 100 for complementary variable gain amplification. In the example environment 100, a computing device 102 communicates with a base station 104 through a wireless communication link 106 (wireless link 106). In this example, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radar, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, server device, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as second-generation (2G), third-generation (3G), fourth-generation (4G), fifth-generation (5G), IEEE 802.11 (e.g., Wi-Fi™), IEEE 802.15 (e.g., Bluetooth™) IEEE 802.16 (e.g., WiMAX™), and so forth.

In some implementations, the wireless link 106 may wirelessly provide power and the base station 104 may comprise a power source.

As shown, the computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless local area network (LAN) (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving signals via an antenna 130. Components of the wireless transceiver 120 can include amplifiers, switches, mixers, analog-to-digital converters, filters, and so forth for conditioning signals. The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receiver chains). In general, the wireless transceiver 120 processes data and/or signals associated with communicating data of the computing device 102 over the antenna 130.

The wireless transceiver 120 includes a processor 122. The processor 122, which may comprise a modem, can be implemented within or separate from the wireless transceiver 120. Although not explicitly shown, the processor 122 can include a portion of the CRM 110 or can access the CRM 110 to obtain computer-readable instructions. The processor 122 controls the wireless transceiver 120 and enables wireless communication to be performed. The processor 122 can include baseband circuitry to perform high-rate sampling processes that can include analog-to-digital conversion, digital-to-analog conversion, gain correction, skew correction, frequency translation, and so forth. The processor 122 can provide communication data to the wireless transceiver 120 for transmission. The processor 122 can also process a baseband version of a signal accepted from the wireless transceiver 120 to generate data, which can be provided to other parts of the computing device 102 via a bus or other communication interface.

Although not explicitly depicted, the wireless transceiver 120 or the processor 122 can also include a controller. The controller can include at least one processor and at least one CRM, such as the application processor 108 and the CRM 110. The CRM can store computer-executable instructions, such as the instructions 112. The processor and the CRM can be localized at one module or one integrated circuit chip or can be distributed across multiple modules or chips. Together, a processor and associated instructions can be realized in separate circuitry, fixed logic circuitry, hard-coded logic, and so forth. The controller can be implemented as part of the wireless transceiver 120, the processor 122, a modem, a general-purpose processor, a processor designed to facilitate wireless communication, some combination thereof, and so forth.

In general, the processor 122 or the controller can control an operational mode of the wireless transceiver 120 or have knowledge of a current operational mode. Different types of operational modes may include different power modes (e.g., a low-power mode or a high-power mode), different resource control states (e.g., a connected mode, an inactive mode, or an idle mode), different modulation modes (e.g., a lower-order modulation mode such as quadrature phase-shift keying (QPSK) modes or higher-order modulation modes such as 64 quadrature amplitude modulation (QAM) or 256 QAM), and so forth.

The wireless transceiver 120 also includes a variable gain amplifier (VGA) 124, which may be implemented within an intermediate-frequency (IF) stage of a transmit chain or a receive chain and may comprise a current-mode variable gain amplifier. In the IF stage, the variable gain amplifier 124 is configured to amplify intermediate-frequency signals, such as those having frequencies around 10 gigahertz (GHz) (e.g., between 1 and 15 GHz). The variable gain amplifier 124 includes at least a first amplifier 126 with an output that is coupled to an active load. The first amplifier 126 and the active load include transistors with different doping types (e.g., transistors having similar regions with n doping or p doping). In some cases, the active load comprises a second amplifier 128, and the first amplifier 126 and the second amplifier 128 are cascaded together in series. The variable gain amplifier 124 may include multiple amplifiers (e.g., two amplifiers or more than two amplifiers) that are cascaded together and implemented with transistors of alternating doping types (e.g., n-type transistors followed by p-type transistors followed by n-type transistors and so forth, or vice versa). The variable gain amplifier 124, which is further described with reference to FIG. 2, can at least partially implement complementary variable gain amplification.

Figure 2:
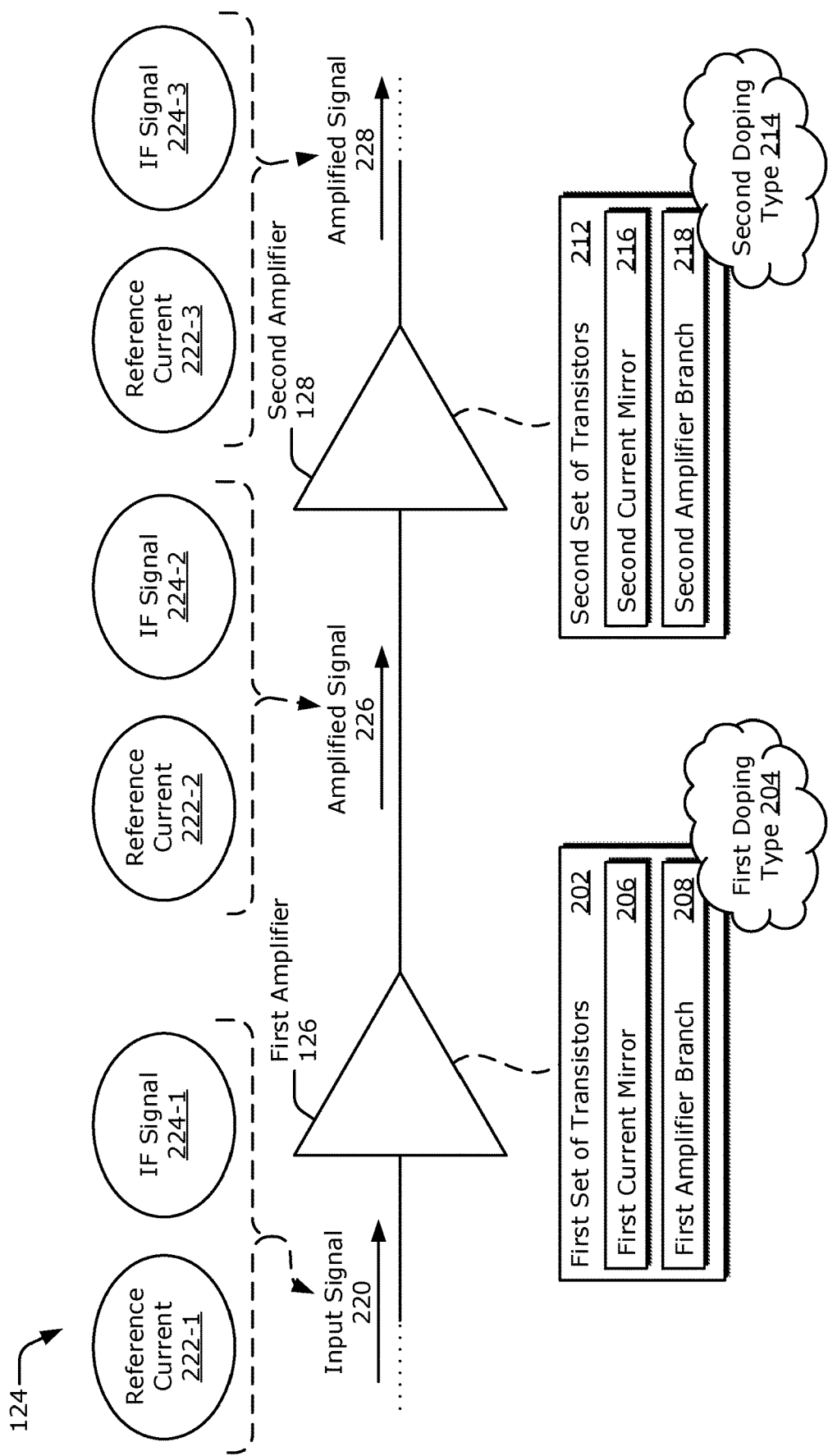
FIG. 2 illustrates an example variable gain amplifier for complementary variable gain amplification.

FIG. 2 illustrates an example variable gain amplifier 124 for complementary variable gain amplification. In the depicted configuration, the variable gain amplifier 124 includes the first amplifier 126 and the second amplifier 128, which are cascaded together in series (e.g., cascaded together in a chained arrangement). Although not shown, the variable gain amplifier 124 may be coupled to other components within the wireless transceiver 120, such as mixers, filters, or other amplifiers. The first amplifier 126 includes a first set of transistors 202, which are implemented with a first doping type 204. At least a portion of the first set of transistors 202 implements a first current mirror 206. In some implementations, the first set of transistors 202 may also implement at least a first amplifier branch 208. A portion of the first current mirror 206 may implement a part of the first amplifier branch 208. The second amplifier 128 includes a second set of transistors 212, which are implemented with a second doping type 214. In some cases, at least a portion of the second set of transistors 212 implement a second current mirror 216, implement at least a second amplifier branch 218, or implement both the second current mirror 216 and the second amplifier branch 218. If the second amplifier 128 includes both the second current mirror 216 and the second amplifier branch 218, a portion of the second current mirror 216 may implement a part of the second amplifier branch 218.

As an example, the first set of transistors 202 may comprise n-channel metal-oxide-semiconductor field-effect transistors (NMOSFETs), and the second set of transistors 212 may comprise p-channel metal-oxide-semiconductor field-effect transistors (PMOSFETs). Alternatively, the first set of transistors 202 may comprise PMOSFETs, and the second set of transistors 212 may comprise NMOSFETs. Other types of complementary transistors may also be used, such as bipolar junction transistors (BJTs) with alternating NPN and PNP doping types. Although two amplifiers are shown in FIG. 2, the variable gain amplifier 124 may include more than two amplifiers that are coupled together in series with alternating doping types. For example, a third amplifier may be coupled to an output of the second amplifier 128 and include a third set of transistors having the first doping type 204. Likewise, a fourth amplifier may be coupled to an output of the third amplifier and include a fourth set of transistors having the second doping type 214. The amplifiers that are cascaded together within the variable gain amplifier 124 may provide different or similar amounts of gains and may have different or similar quantities of amplifier branches.

Figures 1, 3:
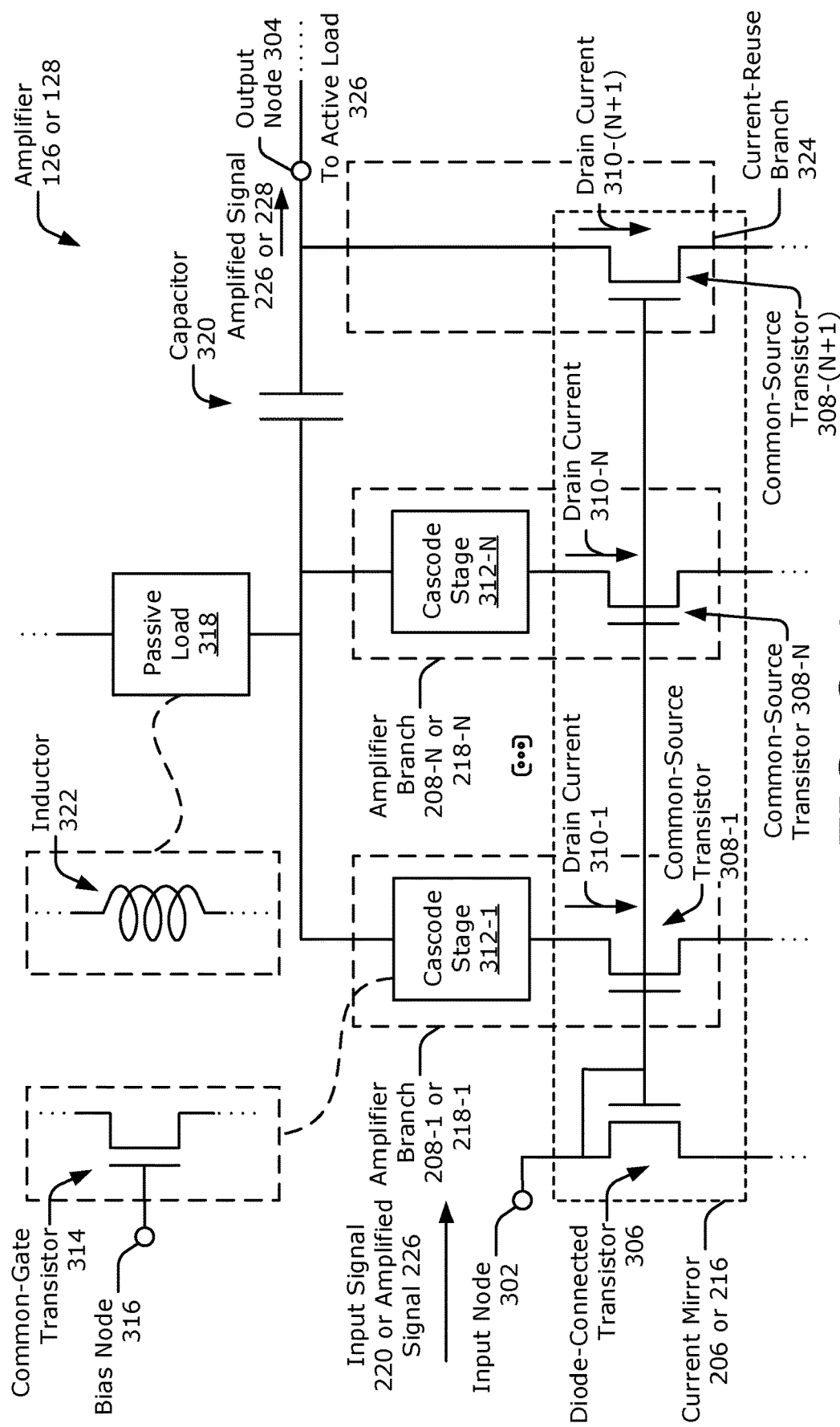
Figures 2, 3:
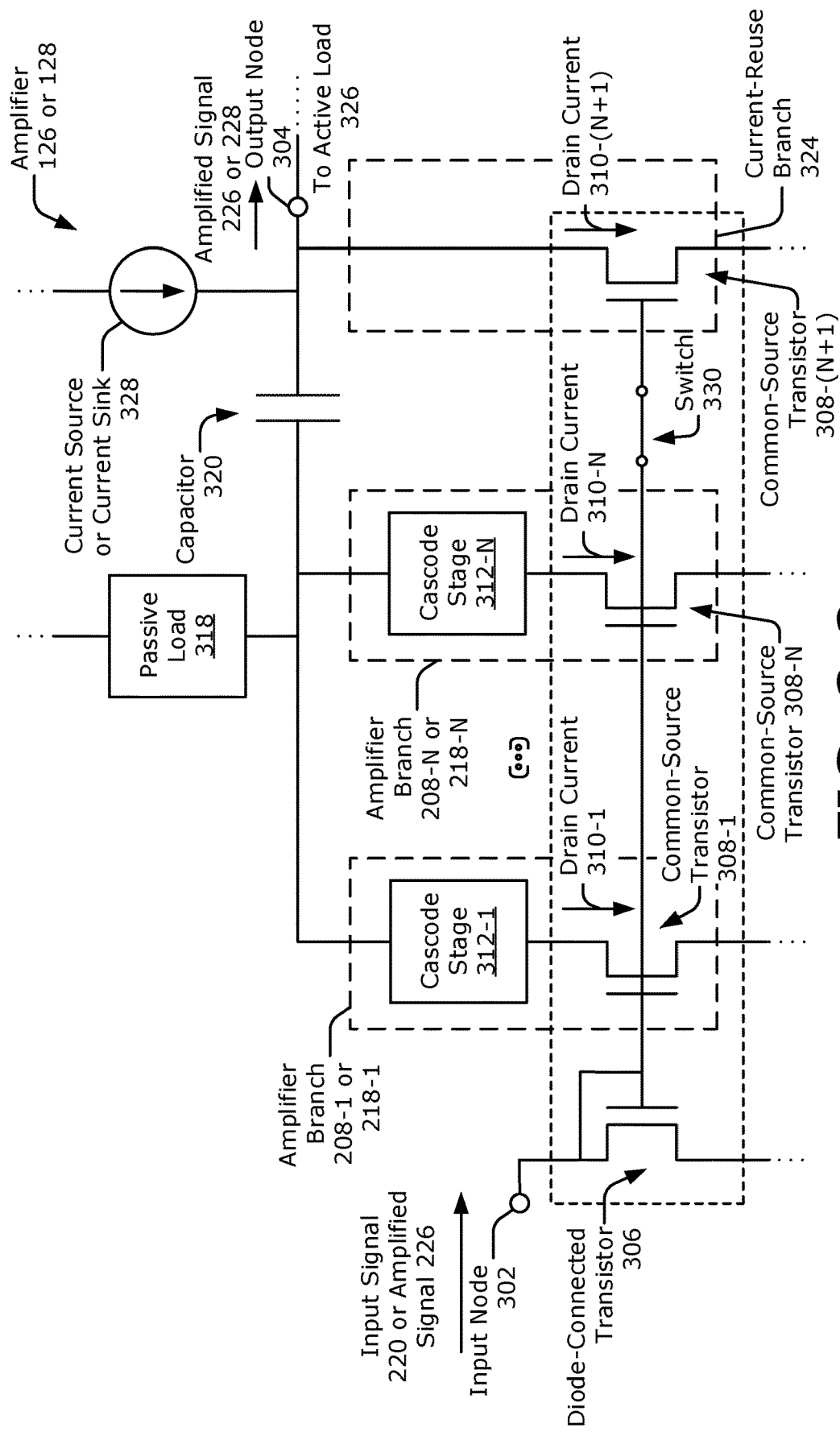

The first amplifier 126 accepts an input signal 220, which comprises a direct current (DC) and an alternating current (AC). The DC current comprises a first reference current 222-1, which is used to bias at least a portion of the first set of transistors 202. The first reference current 222-1 may be set via a current source or current sink (not shown) that is coupled to an input of the first amplifier 126. The first current mirror 206 mirrors or replicates the first reference current 222-1 to produce one or more drain currents within the first amplifier 126, as shown in FIG. 3-1. Although the term "mirror" or "replicate" may be used herein, it is understood that the drain currents produced via the current mirror 206 may be approximately equal to the first reference current 222-1 or a scaled version of the first reference current 222-1. The AC current comprises a first intermediate-frequency signal 224-1, which carries data that is communicated via the wireless link 106 of FIG. 1. In general, the input signal 220 represents a superposition of the first reference current 222-1 and the first IF signal 224-1.

Using the first set of transistors 202, the first amplifier 126 produces an amplified signal 226 based on the input signal 220. The amplified signal 226 includes a second reference current 222-2 and a second intermediate-frequency signal 224-2. Through current steering, the first current mirror 206 produces at least a portion of the second reference current 222-2, which is based on (e.g., dependent upon or derived from) the first reference current 222-1. Depending on a current gain or current transfer ratio of the first current mirror 206, the second reference current 222-2 may be similar or different to the first reference current 222-1. The first amplifier 126 may also include a current source or a current sink, which further adjusts the second reference current 222-2, as described with respect to FIG. 3-2. The first current mirror 206 and/or the first current branch 208 produce the second intermediate-frequency signal 224-2 based on the first IF signal 224-1. A gain between the second IF signal 224-2 and the first IF signal 224-1 is based on a gain of the first amplifier 126, which can vary depending on whether the first amplifier branch 208 is enabled or disabled.

Similar to the first amplifier 126, the second amplifier 128 uses the second set of transistors 212 to produce an amplified signal 228 based on the amplified signal 226. The amplified signal 228 includes a third IF signal 224-3, which is based on the second IF signal 224-2. The third IF signal 224-3 may be produced via the second current mirror 206, the second amplifier branch 218, or a combination thereof. If the second amplifier 128 is coupled to another active load (e.g., a third amplifier), the amplified signal 228 may also include a third reference current 222-3, which is based on the second reference current 222-2. The second current mirror 216 replicates the second reference current 222-2 to produce at least a portion of the third reference current 222-3.

The first amplifier branch 208 and the second amplifier branch 218 control an amount or amounts by which the first IF signal 224-1 is amplified via the first amplifier 126 and the second amplifier 128 to produce the second IF signal 224-2 and the third IF signal 224-3, respectively. A total gain of the variable gain amplifier 124 may be adjusted by enabling or disabling different combinations of the at least one first amplifier branch 208 and the at least one second amplifier branch 218, as further described with respect to FIG. 3-1. In general, the processor 122 or a controller of the wireless transceiver 120 (of FIG. 1) may adjust the total gain of the variable gain amplifier 124 according to a current operational mode to achieve a target gain and power consumption.

By using the first and second current mirrors 206 and 216, the first reference current 222-1 that is accepted at the input of the first amplifier 126 may be replicated at various locations for biasing the amplifier stages via current steering. In this way, the first, second, and third reference currents 222-1, 222-2, and 222-3 track each other in case of changes in power supply voltage or in temperature. In other words, the first or second current mirrors 206 or 216 reuse a bias voltage produced via (e.g., responsive to) the first or second reference current 222-1 or 222-2 to produce other reference currents (e.g., the second or third reference current 222-2 or 222-3) that bias a subsequent amplifier or active load (e.g., the second amplifier 128 or the third amplifier). This differs from other techniques that may generate independent reference currents at each amplifier stage (e.g., produce other reference currents that are independent of a reference current that is mirrored in a previous amplifier stage). With this current reuse, overall current consumption within the variable gain amplifier 124 may be reduced by approximately 20 to 30 percent compared to other designs. The reduced current consumption results in reduced power consumption without significantly affecting gain or noise figure performance. Because the doping types of the amplifiers are alternated within the chain, this reuse technique may be applied to multiple amplifier stages, which further reduces power consumption. Different implementations of the first amplifier 126 or the second amplifier 128 are further described with respect to FIGS. 3-1 and 3-2.

FIG. 3-1 illustrates an example implementation of the first amplifier 126 or the second amplifier 128 for complementary variable gain amplification. The first or second amplifier 126 or 128 includes an input node 302 and an output node 304. In the depicted configuration, the transistors are shown as generic transistors, which represent the first or second set of transistors 202 or 212 shown in FIG. 2. These transistors may have either doping type 204 or 214 (e.g., the sets of transistors may comprise NMOSFETs or PMOSFETs). At least a portion of the first or second set of transistors 202 or 212 within the first or second amplifier 126 or 128 implement the first or second current mirror 206 or 216, which is indicated in FIG. 3-1.

The first or second current mirror 206 or 216 includes a diode-connected transistor 306 and at least one common-source transistor, such as common-source transistors 308-1 to 308-(N+1), where N represents a positive integer. The common-source transistors 308-1 to 308-(N+1) may be sized similarly or differently relative to the diode-connected transistor 306 and each other. Both a gate and a drain of the diode-connected transistor 306 are coupled to the input node 302. Because the gate and drain of the diode-connected transistor 306 are shorted together, the diode-connected transistor 306 operates in a saturation mode. Respective gates of the common-source transistors 308-1 to 308-(N+1) are coupled to the gate (and thus also the drain) of the diode-connected transistor 306. The first or second reference current 222-1 or 222-2 (of FIG. 2), which is accepted at the input node 302 as part of the input signal 220 or the amplifier signal 226, respectively, biases the voltage at the gate and the drain of the diode-connected transistor 306.

The gate and drain voltage of the diode-connected transistor 306 biases the common-source transistors 308-1 to 308-(N+1). Assume, for example, that respective sources of the diode-connected transistor 306 and the common-source transistors 308-1 to 308-N+1 are coupled to a common node, such as to a power supply or a ground depending on the first or second doping type 204 or 214. Under this assumption, a gate-to-source voltage of the diode-connected transistor 306 is relatively similar to respective gate-to-source voltages of the common-source transistors 308-1 to 308-N+1. The respective gate-to-source voltages activate the common-source transistors 308-1 to 308-(N+1). The common-source transistors 308-1 to 308-(N+1) produce drain currents 310-1 to 310-(N+1) based on the first or second reference current 222-1 or 222-2.

A relationship between the drain currents 310-1 to 310-(N+1) and the first or second reference current 222-1 or 222-2 is characterized by a current gain or current transfer ratio of the first or second current mirror 206 or 216. If geometries (e.g., gate widths and lengths) of the diode-connected transistor 306 and the common-source transistors 308-1 to 308-(N+1) are similar, the drain currents 310-1 to 310-(N+1) are approximately equal to the first or second reference current 222-1 or 222-2. Alternatively if the geometries of the diode-connected transistor 306 and the common-source transistors 308-1 to 308-(N+1) are different, the drain currents 310-1 to 310-(N+1) may be scaled versions of the first or second reference current 222-1 or 222-2, and therefore differ from the first or second reference current 222-1 or 222-2.

The first or second amplifier 126 or 128 also includes multiple first or second amplifier branches 208-1 to 208-N or 218-1 to 218-N, respectively. Each respective branch of the multiple first or second amplifier branches 208-1 to 208-N or 218-1 to 218-N includes the corresponding respective common-source transistor 308-1 to 308-N. Thus, each respective common-source transistor 308-1 to 308-N implements an input stage of a respective amplifier branch. Each respective amplifier branch 208-1 to 208-N or 218-1 to 218-N also includes at least one cascode stage, such as respective cascode stages 312-1 to 312-N. The cascode stages 312-1 to 312-N are coupled to respective drains of the common-source transistors 308-1 to 308-N. Each cascode stage 312-1 to 312-N may include at least one resistor (not shown) or at least one common-gate transistor 314. The common-gate transistor 314 can have the same first or second doping type 204 or 214 of the other transistors of the given amplifier. Each respective common-gate transistor 314 includes a gate that is connected to a bias node 316 and a source that is connected to a drain of the corresponding common-source transistor 308-1 to 308-N.

The first or second amplifier branches 208-1 to 208-N or 218-1 to 218-N may be individually enabled or disabled by the processor 122 or the controller as described above by setting bias voltages that are applied to the respective bias nodes 316. If enabled, each amplifier branch of the first or second amplifier branches 208-1 to 208-N or 218-1 to 218-N may produce at least a portion of the first or second amplified signal 226 or 228. By having different quantities or combinations of the first or second amplifier branches 208-1 to 208-N or 218-1 to 218-N enabled, the first or second amplifier 126 or 128 can provide different gains at different times (e.g., vary an amount the first or second IF signal 224-1 or 224-2 is amplified).

The first or second amplifier branches 208-1 to 208-N or 218-1 to 218-N are coupled in parallel with respect to each other between (i) the gate of the diode-connected transistor 306 and (ii) both a passive load 318 and a capacitor 320 as shown. The passive load 318 may be implemented as an inductor 322 and may be further coupled to a ground or a power supply depending on the first or second doping type 204 or 214. The capacitor 320 behaves as a short circuit at frequencies of the first or second intermediate-frequency signal 224-1 or 224-2 and blocks DC signals. In this way, the first or second IF signals 224-1 or 224-2 that are amplified via the first or second amplifier branches 208-1 to 208-N or 218-1 to 218-N may pass through the capacitor 320 to represent at least a portion the second or third IF signal 224-2 or 224-3 at the output node 304. Due to the capacitor 320, however, a DC portion of the drain currents 310-1 to 310-N does not substantially contribute to the second or third reference current 222-2 or 222-3.

The first or second amplifier 126 or 128 also includes a current-reuse branch 324, which includes the common-source transistor 308-(N+1). In the depicted configuration, the current-reuse branch 324 does not include a cascode stage and has a gate that is coupled to both the gate and the drain of the diode-connected transistor 306. The drain current 310-(N+1) produced via the common-source transistor 308-(N+1) contributes to both the second or third reference current 222-2 or 222-3 and the second or third IF signal 224-2 or 224-3, which are represented by the amplified signal 226 or 228, respectively. In this configuration, the output node 304 is configured to couple to an active load 326, such as the second current mirror 216 shown in FIG. 4. The active load 326 can include at least one transistor, which has a different doping type. By providing the second or third reference current 222-2 or 222-3 at the output node 304, the second or third reference current 222-2 or 222-3 biases this transistor of the active load 326.

Instead of having multiple independent current sources or current sinks, the variable gain amplifier 124 can include as few as a single independent current source coupled to the input node 302 because at least a portion of the first reference current 222-1 is mirrored to subsequent amplifiers. The variable gain amplifier 124 can also include fewer first or second amplifier branches 208-1 to 208-N or 218-1 to 218-N because some of the first or second intermediate-frequency signal 224-1 or 224-2 is passed through the current-reuse branch 324. For a low-power mode, the processor 122 or the controller may configure the variable gain amplifier 124 by turning off one or more of the first or second amplifier branches 208-1 to 208-N or 218-1 to 218-N so that the second or third IF signal 224-2 or 224-3 at the output node 304 is produced via the current-reuse branch 324. In these different ways, the variable gain amplifier 124 decreases current consumption and realizes increased power efficiency relative to other architectures. In some cases, the second or third reference current 222-2 or 222-3 may be further adjusted to realize power consumption or linearity performance for different operational modes, as described with respect to FIG. 3-2.

FIG. 3-2 illustrates another example implementation of the first or second amplifier 126 or 128 for complementary variable gain amplification. In contrast to FIG. 3-1, the depicted configuration further includes at least one current source or current sink 328. Additionally or alternatively, the first or second amplifier 126 or 128 may include at least one switch 330. The current source or current sink 328 is coupled between the output node 304 and a power supply or a ground depending on the doping type 204 or 214. The current source or current sink 328 may be implemented as a variable current source or current sink such that an amount of DC current that flows through the current source or current sink 328 can be adjusted by the processor 122 or the controller. By increasing the DC current through the current source or current sink 328, the second or third reference current 222-2 or 222-3 that flows to the active load 326 due to the current-reuse branch 324 is reduced. This can be beneficial for reducing an amount of current that is mirrored in subsequent amplifiers and further reducing power consumption within the variable gain amplifier 124.

The switch 330 is coupled between the gate of the common-source transistor 308-(N+1) and the gate of the diode-connected transistor 306. The switch 330 selectively connects or disconnects the common-source transistor 308-(N+1) to or from the gate and drain of the diode-connected transistor 306. If the switch 330 is in a closed state, at least a portion of the second or third reference current 222-2 or 222-3 is based on the first or second reference current 222-1 or 222-2, respectively. While the switch 330 is in the closed state, the variable gain amplifier 124 may realize target power consumption, target gains, target noise figures, and target linearities for less stringent modes, such as low-power modes or lower-order modulation modes, such as QPSK.

On the other hand, if the switch 330 is in an open state and connects the gate of the common-source transistor 308-(N+1) to a bias voltage (not shown), the current-reuse branch 324 behaves as another independent current source or current sink that can generate a different reference current for the following amplifier. Although the reference current is not a replica of (or dependent upon) the first or second reference current 222-1 or 222-2 that is accepted at the input node 302 for the open-switch state, this configuration can be used to realize increased linearity for higher-order modulation modes, such as 64 or 256 QAM modes. Through use of the switch 330, the processor 122 or the controller may dynamically tailor performance of the variable gain amplifier 124 based on a current operational mode of the wireless transceiver 120 (e.g., based on whether the current operational mode is designed to achieve a target power conservation or a target linearity performance).

Figure 4:
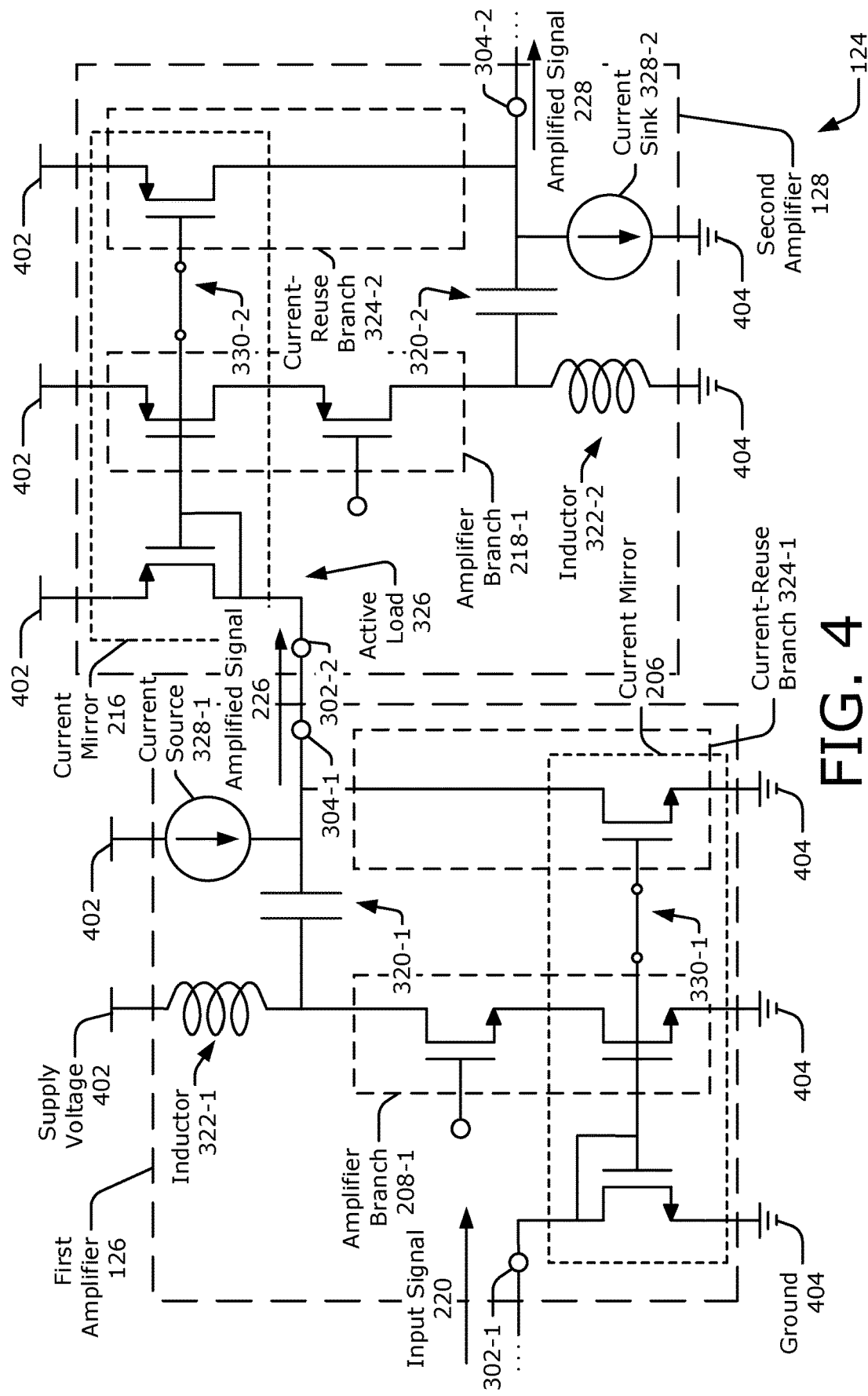
FIG. 4 illustrates an example implementation of multiple amplifiers cascaded together for complementary variable gain amplification.

FIG. 4. illustrates an example implementation of multiple amplifiers cascaded together for complementary variable gain amplification. In the depicted configuration, the variable gain amplifier 124 includes the first amplifier 126 and the second amplifier 128, which are respectively implemented with NMOSFETs and PMOSFETs here. The NMOSFETs and PMOSFETs respectively implement the first and second current mirrors 206 and 216, at least a portion of the first and second amplifier branches 208-1 and 218-1, and the first and second current-reuse branches 324-1 and 324-2. Depending on the doping types 204 or 214, the transistors have nodes that are coupled to a supply voltage 402 or a ground 404. The first amplifier 126 and the second amplifier 128 are also shown to respectively include first and second capacitors 320-1 and 320-2, first and second inductors 322-1 and 322-2, and first and second switches 330-1 and 330-2. The first amplifier 126 also includes a current source 328-1, a first input node 302-1, and a first output node 304-1. The second amplifier 128 includes a current sink 328-2, a second input node 302-2, and a second output node 304-2. The first output node 304-1 and the second input node 302-2 are coupled together such that the first amplifier 126 and the second amplifier 128 are cascaded together in series.

From left to right, the input signal 220 is accepted at the first input node 302-1 and is mirrored across or over to the first amplifier branch 208-1 to produce the drain current 310-1 (shown in FIG. 3-1). The first IF signal 224-1 is amplified by the first amplifier branch 208-1 and passes through the first capacitor 320-1 to the second input node 302-2 of the second amplifier 128. If the first switch 330-1 is in the closed state, the input signal 220 is also mirrored across or over to the first current-reuse branch 324-1. Thus, the first IF signal 224-1 passes through the first current-reuse branch 324-1 to the second input node 302-2, and at least a portion of the second reference current 222-2 is provided to the second input node 302-2 based on the first reference current 222-1. If the current source 328-1 is in an active state and provides a DC current to the first output node 304-1, the second reference current 222-2 is also based on the DC current that is set via the current source 328-1. The second reference current 222-2 at the second input node 302-2 biases the second current mirror 216.

Similar to the first amplifier 126, the second amplifier 128 mirrors the amplified signal 226 across or over to the second amplifier branch 218-1. The second IF signal 224-2 contained within the amplified signal 226 is amplified by the second amplifier branch 218-1 and passes through the second capacitor 320-2 to the second output node 304-2. If the second switch 330-2 is in the closed state, the amplified signal 226 is also mirrored across or over to the current-reuse branch 324-2. Thus, the second IF signal 224-2 passes through the second current-reuse branch 324-2 to the second output node 304-2, and at least a portion of the third reference current 222-3 is provided to the second output node 304-2 based on the second reference current 222-2. If the current sink 328-2 is in the active state and pulls another DC current from the second output node 304-2 to the ground 404, the third reference current 222-3 is also based on the other DC current. In FIG. 4, the second amplifier 128 is shown to include both the second amplifier branch 218-1 and the current-reuse branch 324-2. However, if the second amplifier 128 is a last amplifier within the variable gain amplifier 124, the second amplifier 128 may alternatively include either the second current-reuse branch 324-2 or the second amplifier branch 218-1 (but not both). In this case, the second amplifier 128 may also include another capacitor that is coupled between the current-reuse branch 324-2 and the output node 304-2 such that the amplified signal 228 does not include another reference current.

FIG. 5 is a flow diagram illustrating an example process 500 for complementary variable gain amplification. The process 500 is described in the form of a set of blocks 502-508 that specify operations that can be performed. However, operations are not necessarily limited to the order shown in FIG. 5 or described herein, for the operations may be implemented in alternative orders or in fully or partially overlapping manners. Operations represented by the illustrated blocks of the process 500 may be performed by a wireless transceiver 120 (e.g., of FIG. 1) or a variable gain amplifier 124 (e.g., of FIG. 1 or 2). More specifically, the operations of the process 500 may be performed by a first amplifier 126 and a second amplifier 128, as described in FIGS. 1-4.

At block 502, an input signal is accepted via a first amplifier comprising a first set of transistors having a first doping type. The input signal comprises a first intermediate-frequency signal and a first reference current. For example, the first amplifier 126 of FIG. 2 can accept the input signal 220. The first amplifier 126 can include the first set of transistors 202, which have the first doping type 204. In FIG. 4, the first set of transistors 202 are implemented with NMOSFETs, however other implementations may be realized with PMOSFETs in the first set of transistors 202. The input signal 220 can comprise the first intermediate-frequency signal 224-1, which may be provided via a mixer or another component within the wireless transceiver 120, and the first reference current 222-1, which may be set by a current source or a current sink that is coupled to the input node 302 of the first amplifier 126. In general, the first intermediate-frequency signal 224-1 comprises an AC signal, and the first reference current 222-1 comprises a DC current.

At block 504, a first amplified signal is produced via the first set of transistors. The first amplified signal comprises a second intermediate-frequency signal, which is based on the first intermediate-frequency signal, and a second reference current, which is based on the first reference current. For example, the first amplifier 126 can produce the amplified signal 226 via the first set of transistors 202. The amplified signal 226 can comprise the second intermediate-frequency signal 224-2, which may be similar to the first intermediate-frequency signal 224-1 or an amplified version of the first intermediate-frequency signal 224-1. The amplified signal 226 can also comprise the second reference current 222-2. At least a portion of the second reference current 222-2 is based on the first reference current 222-1. Through the first current mirror 206, the first reference current 222-2 may be provided via the drain current 310-(N+1) produced via the current-reuse branch 324. Through current steering, at least a portion of the second reference current 222-2 is based on the first reference current 222-1 that is accepted at the input node 302. If the first amplifier 126 includes the current source or current sink 328, the second reference current 222-2 may also be based on the amount of DC current that flows through the current source or the current sink 328. The second intermediate-frequency signal 224-2 and the second reference current 222-2 may be produced via at least the current-reuse branch 324. In some implementations, one or more of the first amplifier branches 208-1 to 208-N may also be enabled to provide at least a portion of the second intermediate-frequency signal 224-2. In this manner, the enabled ones of the amplifier branches 208-1 to 208-N amplify the first intermediate-frequency signal 224-1. Due to the capacitor 320, the drain currents 310-1 to 310-N flowing through the first amplifier branches 208-1 to 208-N do not significantly influence the second reference current 222-2.

At 506, a second amplifier comprising a second set of transistors having a second doping type is biased using the second reference current. For example, the first amplifier 126 can bias the second amplifier 128 by providing the second reference current 222-2 to the second input node 302-2 of the second amplifier 128. The second amplifier 128 includes the second set of transistors 212, which have the second doping type 214. In FIG. 4, the second set of transistors 212 are implemented with PMOSFETs; however, other implementations may be implemented with NMOSFETs. By using the second reference current 222-2 to bias the second set of transistors 212, power may be conserved within the variable gain amplifier 124 by omitting another independent current source or another independent current sink.

At 508, a second amplified signal is produced via the second set of transistors. The second amplified signal comprises a third intermediate-frequency signal, which is based on the second intermediate-frequency signal. For example, the second amplifier 128 can produce the amplified signal 228, which can comprise the third intermediate-frequency signal 224-3. The second amplifier 128 can include at least one second amplifier branch 218, which amplifies the second intermediate-frequency signal 224-2 to produce the third intermediate-frequency signal 224-3. If the second amplifier 128 is not a last amplifier in the chain or is connected to an active load 326, the second amplifier 128 may additionally or alternatively include the second current-reuse branch 324-2. In this case, the amplified signal 228 may also include the third reference current 222-3, which may be used to bias the active load or the third amplifier.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a variable gain amplifier including multiple amplifiers, the multiple amplifiers including at least one first amplifier and at least one second amplifier cascaded together in series;
the first amplifier including a first set of transistors and a first output node, the first set of transistors having a first doping type, at least a portion of the first set of transistors configured to implement a first current mirror that forms at least a portion of one or more amplifier branches of the first amplifier, the one or more amplifier branches coupled together via the first output node; and
the second amplifier including a second set of transistors having a second doping type, at least a portion of the second set of transistors configured to implement a second current mirror, the second current mirror coupled to the first current mirror via the first output node.

2. The apparatus of claim 1, wherein:
the first current mirror is configured to produce at least a first reference current; and
the second current mirror is configured to produce at least a second reference current based on at least a portion of the first reference current.

3. The apparatus of claim 1, wherein:
the first set of transistors comprises n-channel metal-oxide-semiconductor field-effect transistors (NMOSFETs); and
the second set of transistors comprises p-channel metal-oxide-semiconductor field-effect transistors (PMOSFETs).

4. The apparatus of claim 1, wherein:
the first set of transistors comprises p-channel metal-oxide-semiconductor field-effect transistors (PMOSFETs); and
the second set of transistors comprises n-channel metal-oxide-semiconductor field-effect transistors (NMOSFETs).

5. The apparatus of claim 1, wherein:
the first amplifier includes:
a first input node; and
the first current mirror includes:
a first diode-connected transistor having both a gate of the first diode-connected transistor and a drain of the first diode-connected transistor coupled to the first input node; and
a second common-source transistor having a gate of the second common-source transistor and a drain of the second common-source transistor, the gate of the second common-source transistor coupled to the drain of the first diode-connected transistor, and the drain of the second common-source transistor coupled to the first output node; and
the second amplifier includes:
a second input node coupled to the first output node; and
the second current mirror includes a third diode-connected transistor having both a gate of the third diode-connected transistor and a drain of the third diode-connected transistor coupled to the second input node.

6. The apparatus of claim 5, wherein the first current mirror includes a switch coupled between the drain of the first diode-connected transistor and the gate of the second common-source transistor.

7. The apparatus of claim 1, wherein the first amplifier includes a current source or current sink coupled to the first output node.

8. The apparatus of claim 5, wherein:
the first diode-connected transistor is configured to accept an input signal at the drain of the first diode-connected transistor, the input signal including a first reference current;

the second common-source transistor is configured to produce at least a portion of a second reference current at the first output node based on the first reference current; and the third diode-connected transistor is configured to accept the second reference current at the drain of the third diode-connected transistor via the second input node.

9. The apparatus of claim 5, wherein:
the first current mirror includes a fourth common-source transistor having a gate of the fourth common-source transistor coupled to the gate of the first diode-connected transistor; and
the first amplifier includes:
  a passive load;
  a first amplifier branch of the one or more amplifier branches that includes the fourth common-source transistor and at least a first cascode stage, the first cascode stage coupled between a drain of the fourth common-source transistor and the passive load; and
  a capacitor coupled between the passive load and the first output node.

10. The apparatus of claim 9, wherein:
the first current mirror includes a fifth common-source transistor having a gate of the fifth common-source transistor coupled to the gate of the first diode-connected transistor; and
the first amplifier includes a second amplifier branch of the one or more amplifier branches, the second amplifier branch includes the fifth common-source transistor and at least a second cascode stage, the second cascode stage coupled between a drain of the fifth common-source transistor and the passive load.

11. The apparatus of claim 9, wherein the first cascode stage comprises a fifth common-gate transistor having a source of the fifth common-gate transistor and a drain of the fifth common-gate transistor, the source of the fifth common-gate transistor is coupled to the drain of the fourth common-source transistor, and the drain of the fifth common-gate transistor is coupled to both the passive load and the capacitor.

12. The apparatus of claim 9, wherein:
the first diode-connected transistor is configured to accept an input signal at the drain of the first diode-connected transistor, the input signal including a first reference current and an intermediate-frequency signal;
the first amplifier branch is configured to produce a drain current based on the input signal via the fourth common-source transistor; and
the capacitor is configured to block a direct current portion of the drain current from passing to the first output node.

13. An apparatus comprising:
a variable gain amplifier including multiple amplifiers, the multiple amplifiers including at least one first amplifier and at least one second amplifier cascaded together in series;
  the first amplifier including:
    a first input node configured to accept a first reference current;
    a first output node;
    a first set of transistors having a first doping type; and
    first mirroring means for producing at least a portion of a second reference current at the first output node based on the first reference current via at least a portion of the first set of transistors, the first mirroring means forming at least a portion of one or more amplifier branches of the first amplifier, the amplifier branches coupled together via the first output node; and
  the second amplifier including:
    a second input node coupled to the first output node; and
    a second set of transistors having a second doping type, at least a portion of the second set of transistors configured to be biased via the second reference current.

14. The apparatus of claim 13, wherein the first amplifier includes a current source or a current sink coupled to the first output node, the current source or the current sink configured to adjust the second reference current by a predetermined amount.

15. The apparatus of claim 13, wherein the first mirroring means is configured to produce a drain current that is approximately equal to the first reference current, the drain current comprising the portion of the second reference current.

16. The apparatus of claim 13, wherein the first mirroring means is configured to produce a drain current that is a scaled version of the first reference current, the drain current comprising the portion of the second reference current.

17. The apparatus of claim 13, wherein the first mirroring means includes switching means for selectively causing the second reference current to be produced based on the first reference current.

18. The apparatus of claim 13, wherein:
the variable gain amplifier includes a third amplifier;
the second amplifier includes:
  a second output node; and
  second mirroring means for producing at least a portion of a third reference current at the second output node based on the second reference current via at least a portion of the second set of transistors; and
the third amplifier includes:
  a third input node coupled to the second output node; and
  a third set of transistors having the first doping type, at least a portion of the third set of transistors configured to be biased via the third reference current.

19. The apparatus of claim 13, wherein:
the first input node is configured to accept a first intermediate frequency signal; and
the first amplifier includes:
  a passive load;
  a capacitor coupled between the passive load and the first output node; and
  amplifier means for producing a second intermediate-frequency signal at the first output node based on the first intermediate-frequency signal via at least another portion of the first set of transistors, the amplifier means comprising the one or more amplifier branches; and the amplifier means coupled to both the passive load and the capacitor.

20. A method for complementary variable gain amplification, the method comprising:
accepting, via a first amplifier comprising a first set of transistors having a first doping type, an input signal that comprises a first intermediate-frequency signal and a first reference current;
producing, via the first set of transistors, a first amplified signal comprising a second intermediate-frequency signal and a second reference current, the second reference current based on the first reference current, the second intermediate frequency signal based on the first intermediate-frequency signal, at least a portion of the first set of transistors forming one or more amplifier branches of the first amplifier, the one or more amplifier branches coupled together via a first output node of the first amplifier;

biasing, using the second reference current, a second amplifier comprising a second set of transistors having a second doping type, the second amplifier coupled to the first amplifier via the first output node such that the first amplifier and the second amplifier are cascaded together in series; and producing, via the second set of transistors, a second amplified signal comprising a third intermediate-frequency signal, the third intermediate-frequency signal based on the second intermediate-frequency signal.

21. The method of claim 20, further comprising:
biasing, using a third reference current, a third amplifier comprising a third set of transistors having the first doping type; and
producing, via the third set of transistors, a third amplified signal comprising a fourth intermediate-frequency signal, the fourth intermediate frequency signal based on the third intermediate-frequency signal,
wherein the producing of the third amplified signal includes producing the third reference current, the third reference current based on the second reference current.

22. The method of claim 20, wherein:
the producing of the first amplified signal comprises mirroring, via at least another portion of the first set of transistors, the input signal from a first input node of the first amplifier to the first output node of the first amplifier to produce the first amplified signal; and
the producing of the second amplified signal comprises mirroring, via at least a portion of the second set of transistors, the first amplified signal from a second input node of the second amplifier to a second output of the second amplifier to produce the second amplified signal.

23. A variable gain amplifier comprising:
a first amplifier including:
 a first input node;
 a first output node;
 at least a first amplifier branch;
 a first passive load coupled to the first amplifier branch;
 a first capacitor coupled between the first output node and the first passive load;
 a first current-reuse branch coupled to the first output node; and
 a first set of transistors having a first doping type, the first set of transistors configured to implement a first current mirror, different portions of the first current mirror are included as parts of the first amplifier branch and the first current-reuse branch; and
an active load coupled to the first output node, the active load comprising at least one transistor having a second doping type.

24. The variable gain amplifier of claim 23, wherein the first current mirror includes:
a first diode-connected transistor having both a gate of the first diode-connected transistor and a drain of the first diode-connected transistor coupled to the first input node;
at least two common-source transistors having respective gates coupled to the gate of the first diode-connected transistor, the at least two common-source transistors including:

a second common-source transistor having a drain of the second common-source transistor coupled to a first cascode stage of the first amplifier branch, the second common source transistor and the first cascode stage configured to implement the first amplifier branch; and
a third common-source transistor having a drain of the third common-source transistor coupled to the first output node, the third common-source transistor configured to implement the first current-reuse branch.

25. The variable gain amplifier of claim 24, wherein the first current mirror includes a first switch coupled between a gate of the third common source transistor and both the gate of the first diode-connected transistor and the drain of the first diode connected transistor.

26. The variable gain amplifier of claim 23, wherein the first amplifier includes a first current source or a first current sink coupled to the first output node.

27. The variable gain amplifier of claim 23, wherein:
the first set of transistors comprises multiple n-channel metal oxide semiconductor field-effect transistors (NMOSFETs) and the at least one transistor of the active load comprises a p-channel metal-oxide-semiconductor field-effect transistor (PMOSFET); or
the first set of transistors comprises multiple PMOSFETs and the at least one transistor of the active load comprises an NMOSFET.

28. The variable gain amplifier of claim 23, further comprising a second amplifier configured to implement the active load, the second amplifier including:
a second input node coupled to the first output node;
a second output node;
at least a second amplifier branch;
a second passive load coupled to the second amplifier branch;
a second capacitor coupled between the second output node and the second passive load; and
a second set of transistors having the second doping type, the second set of transistors configured to implement a second current mirror, a portion of the second current mirror included as part of the second amplifier branch.

29. The variable gain amplifier of claim 23, further comprising a second amplifier that is configured to implement the active load, the second amplifier including:
a second input node coupled to the first output node;
a second output node;
a second current-reuse branch coupled to the second output node; and
a second set of transistors having the second doping type, the second set of transistors configured to implement a second current mirror, a portion of the second current mirror included as part of the second current-reuse branch.

30. The variable gain amplifier of claim 23, wherein:
the first input node is configured to accept a first reference current;
the first current mirror is configured to produce at least a portion of a second reference current at the first output node, the portion of the second reference current based on the first reference current; and
the first output node is configured to pass the second reference current to the active load to bias the at least one transistor.

* * * * *